United States Patent
Ito

(10) Patent No.: US 9,583,535 B2
(45) Date of Patent: Feb. 28, 2017

(54) MAGNETORESISTIVE MEMORY DEVICE AND MANUFACTURING METHOD OF THE SAME

(71) Applicant: Yuichi Ito, Seongnam-si, Gyeonggi-do (KR)

(72) Inventor: Yuichi Ito, Seongnam-si, Gyeonggi-do (KR)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 14/939,820

(22) Filed: Nov. 12, 2015

(65) Prior Publication Data
US 2016/0322421 A1 Nov. 3, 2016

Related U.S. Application Data

(60) Provisional application No. 62/155,650, filed on May 1, 2015.

(51) Int. Cl.
| | | |
|---|---|---|
| *H01L 27/22* | (2006.01) | |
| *H01L 43/12* | (2006.01) | |
| *H01L 43/08* | (2006.01) | |
| *H01L 43/02* | (2006.01) | |

(52) U.S. Cl.
CPC .......... *H01L 27/228* (2013.01); *H01L 43/02* (2013.01); *H01L 43/08* (2013.01); *H01L 43/12* (2013.01)

(58) Field of Classification Search
CPC ....... H01L 27/228; H01L 43/08; H01L 48/02; H01L 43/12; H01L 27/788
See application file for complete search history.

(56) References Cited

U.S. PATENT DOCUMENTS

| | | | | |
|---|---|---|---|---|
| 7,241,632 B2* | 7/2007 | Yang | ............ | H01L 43/12 |
| | | | | 257/E21.006 |
| 7,880,249 B2* | 2/2011 | Yuan | ............ | H01L 27/222 |
| | | | | 257/421 |
| 8,912,012 B2* | 12/2014 | Li | ............ | H01L 43/12 |
| | | | | 257/E21.665 |
| 9,306,156 B2* | 4/2016 | Noh | ............ | H01L 43/12 |
| 2010/0032779 A1 | 2/2010 | Tsukamoto et al. | | |
| 2015/0036551 A1* | 2/2015 | Pappas | ............ | H04W 4/22 |
| | | | | 370/260 |
| 2015/0255706 A1* | 9/2015 | Iwayama | ............ | H01L 43/08 |
| | | | | 257/421 |

FOREIGN PATENT DOCUMENTS

| | | |
|---|---|---|
| JP | 2013143548 A | 7/2013 |
| JP | 2013201343 A | 10/2013 |

* cited by examiner

*Primary Examiner* — William Coleman
(74) *Attorney, Agent, or Firm* — Holtz, Holtz & Volek PC

(57) ABSTRACT

According to one embodiment, a magnetoresistive memory device includes a substrate, a first oxide film provided on the substrate, bottom electrodes provided in the first oxide film, a part of each of the bottom electrodes protruding above the first oxide film, magnetoresistive elements provided on the respective bottom electrodes, sidewall nitride films provided on side surfaces of the respective bottom electrodes and the magnetoresistive elements, a second oxide film provided on the magnetoresistive elements, the sidewall nitride films and the first oxide film, and contact electrodes provided in the second oxide film and the first oxide film to reach the substrate from an upper surface of the second oxide film.

18 Claims, 11 Drawing Sheets

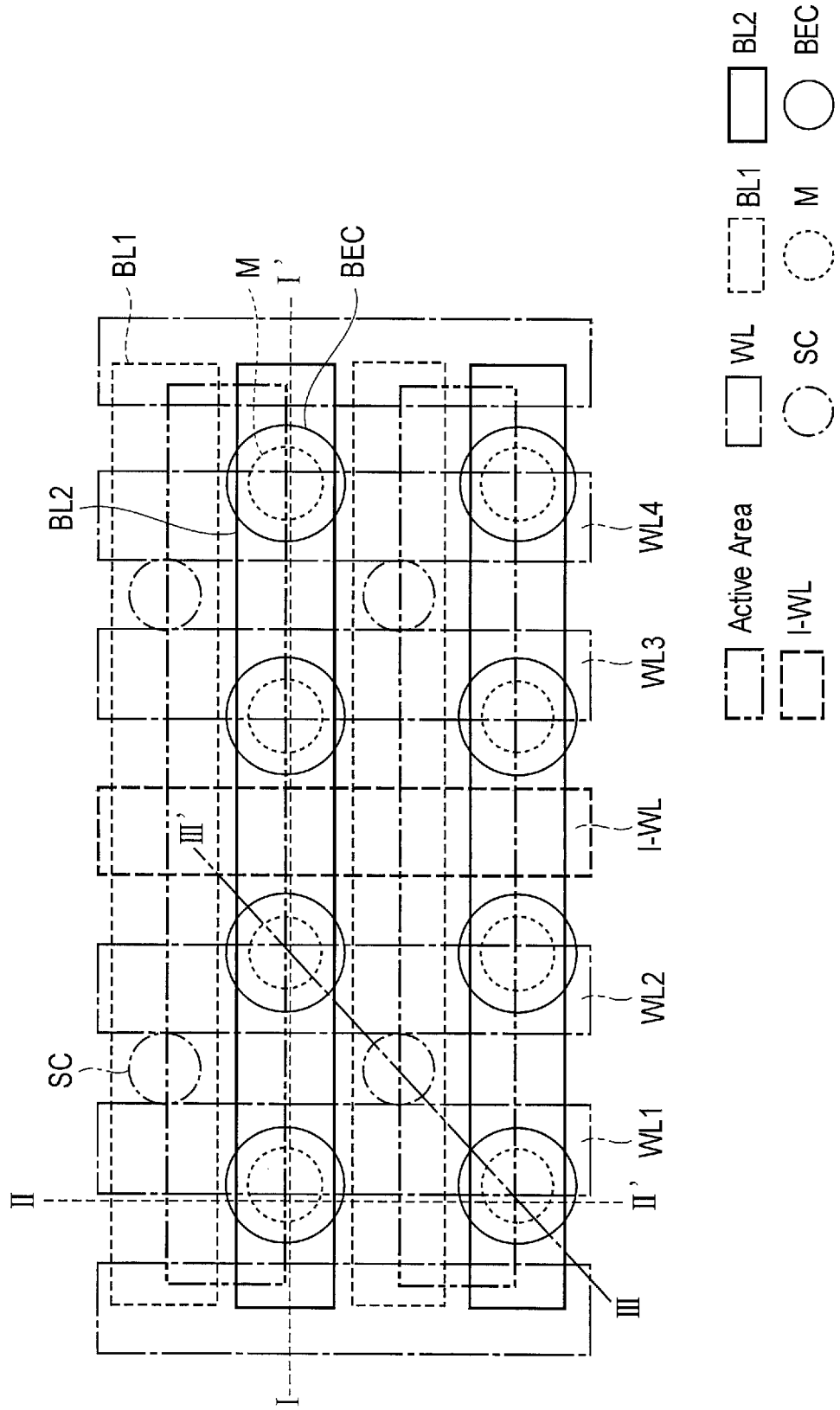
F I G. 1

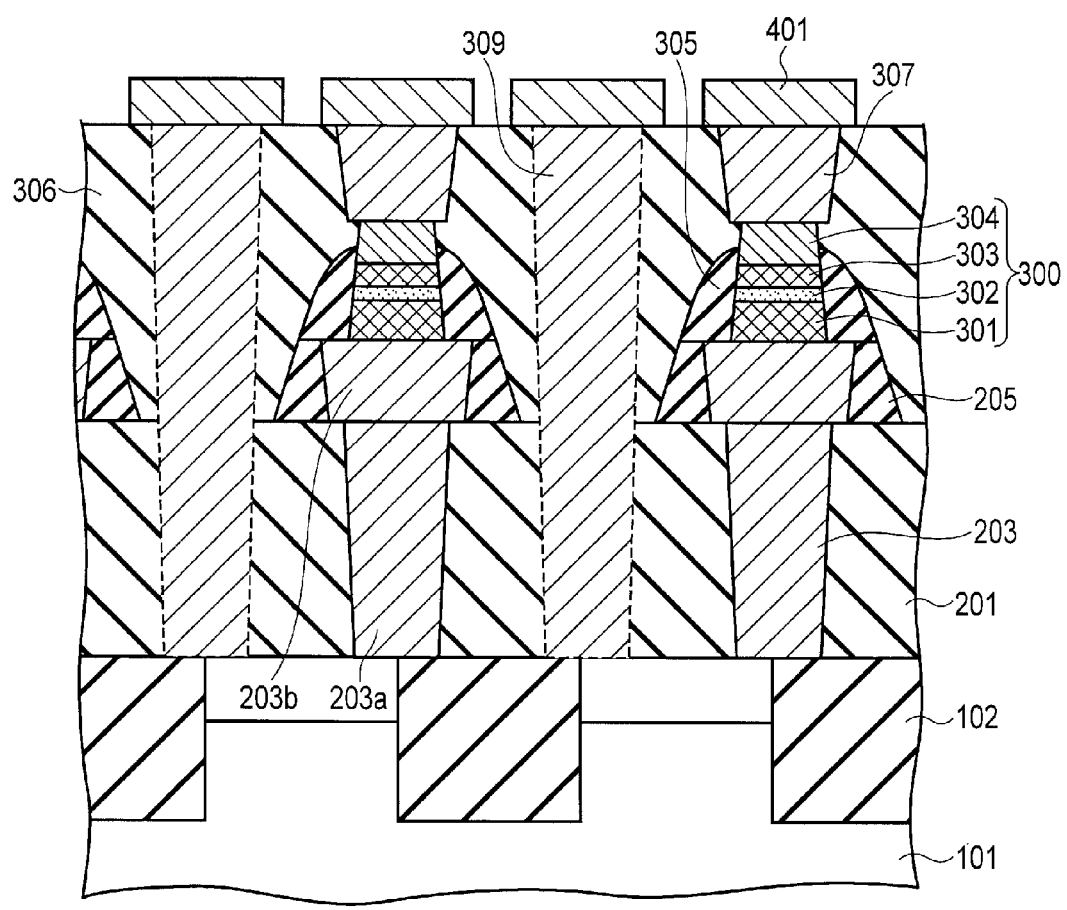
F I G. 4

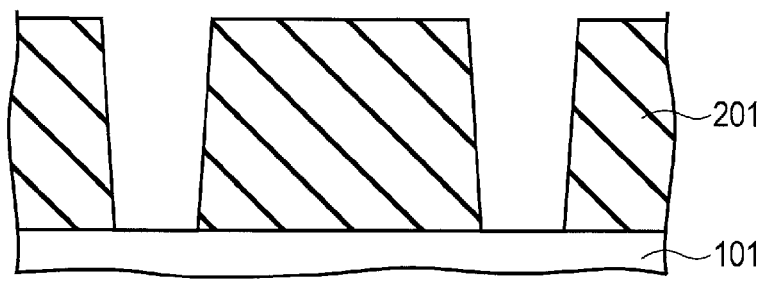
F I G. 6A
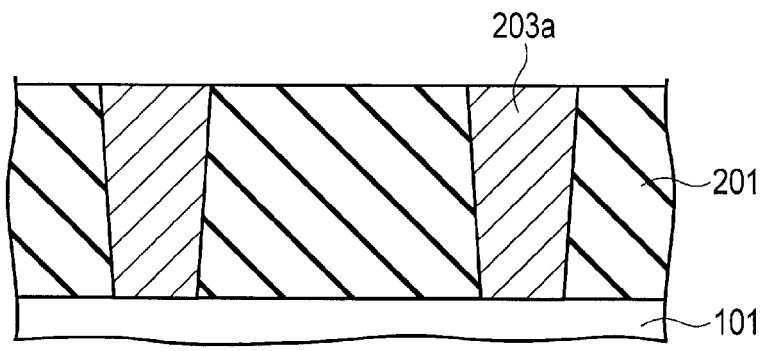
F I G. 6B
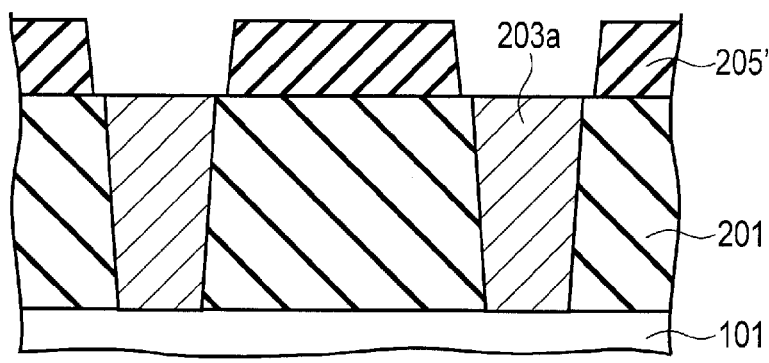
F I G. 6C

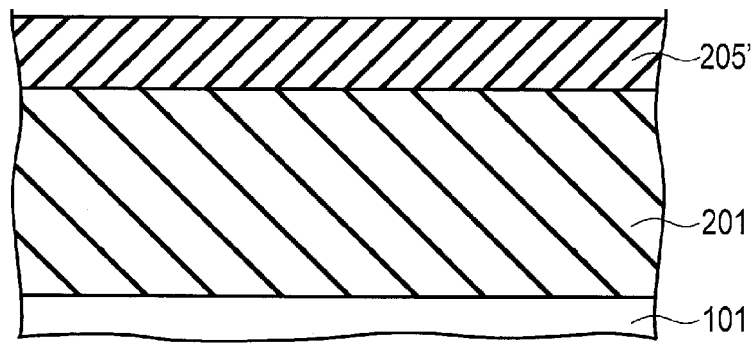
F I G. 7A
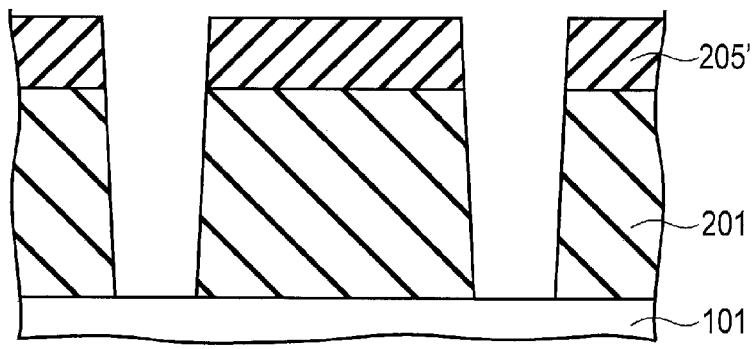
F I G. 7B
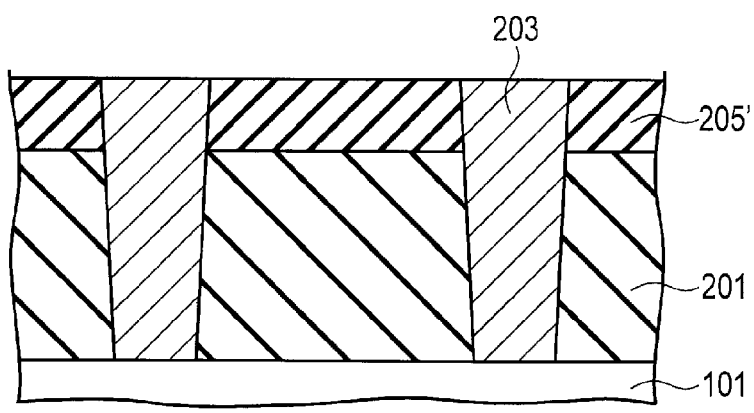
F I G. 7C

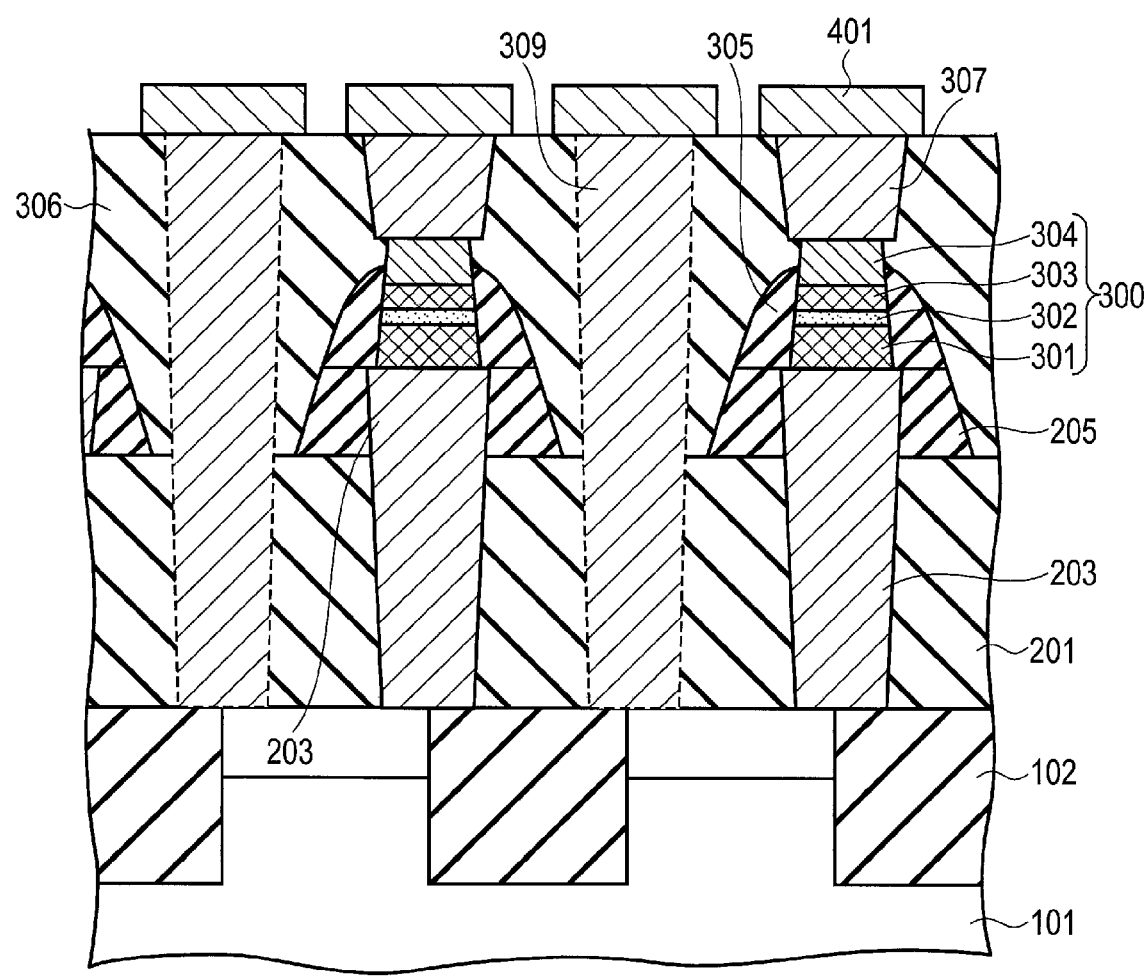
F I G. 9

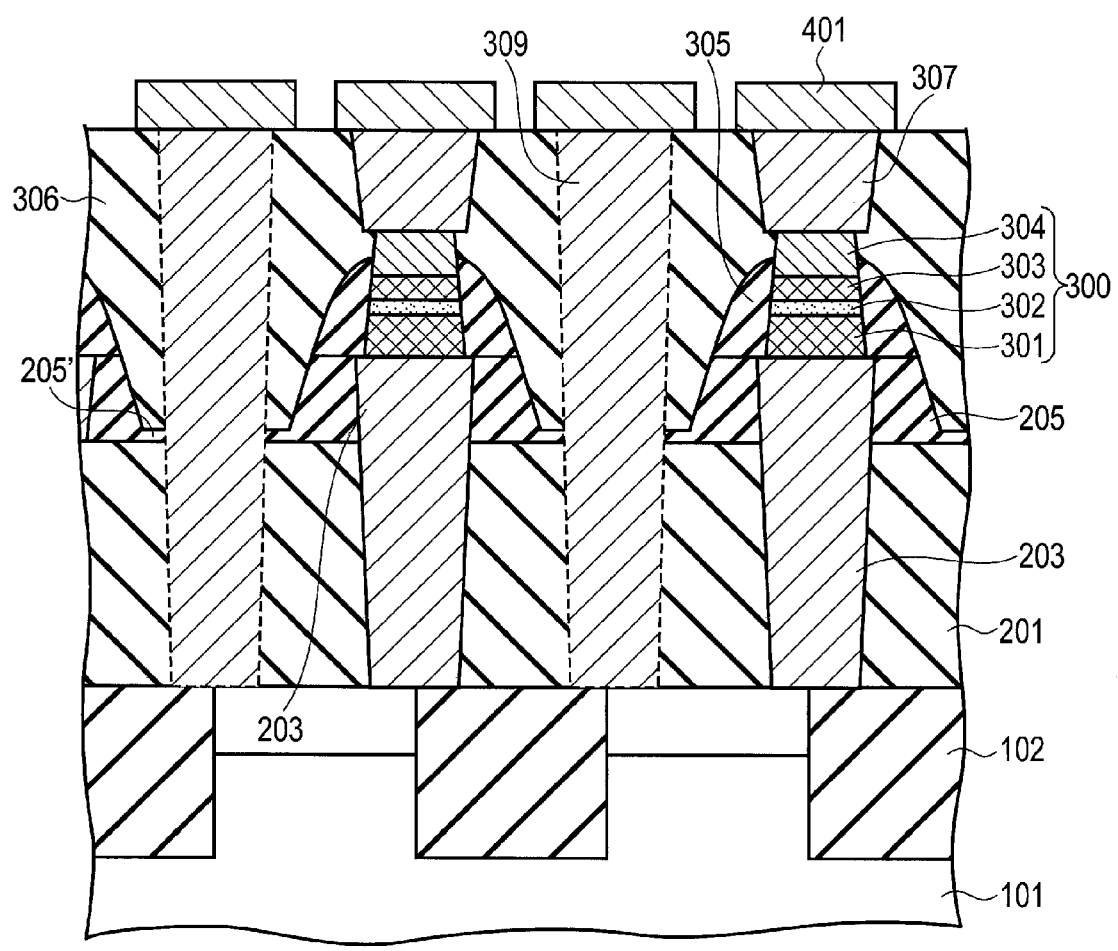
F I G. 11

MAGNETORESISTIVE MEMORY DEVICE AND MANUFACTURING METHOD OF THE SAME

CROSS-REFERENCE TO RELATED APPLICATIONS

This application claims the benefit of U.S. Provisional Application No. 62/155,650, filed May 1, 2015, the entire contents of which are incorporated herein by reference.

FIELD

Embodiments described herein relate generally to a magnetoresistive memory device having an interlayer nitride film structure and a manufacturing method of the same.

BACKGROUND

Recently, a large-capacity magnetoresistive random access memory (MRAM) using magnetic tunnel junction (MTJ) elements has been proposed and is attracting attention. In an MTJ element, one of two magnetic layers that sandwich a tunnel barrier layer is set as a magnetization fixed layer (reference layer) where the direction of magnetization is fixed in order not to be changed, and the other layer is set as a magnetization free layer (storage layer) where the direction of magnetization is made to be easily inverted.

BRIEF DESCRIPTION OF THE DRAWINGS

FIG. 1 is a plan view schematically showing a magnetoresistive memory device of a first embodiment.

FIG. 4 is a detailed cross-sectional view of FIG. 3.

FIGS. 6A to 6C are cross-sectional views showing a process of forming bottom electrodes.

FIGS. 7A to 7C are cross-sectional views showing another example of the process of forming bottom electrodes.

FIG. 9 is a cross-sectional view showing a structure of a modified example of the first embodiment.

FIG. 11 is a cross-sectional view showing a structure of a modified example of the second embodiment.

DETAILED DESCRIPTION

In general, according to one embodiment, a magnetoresistive memory device comprises: a substrate; a first oxide film provided on the substrate; bottom electrodes provided in the first oxide film, a part of each of the bottom electrodes protruding above the first oxide film; magnetoresistive elements provided on the respective bottom electrodes; sidewall nitride films provided on side surfaces of the respective bottom electrodes and side surfaces of the respective magnetoresistive elements; a second oxide film provided on the magnetoresistive elements, the sidewall nitride films and the first oxide film; top electrodes provided in the second oxide film and connected to the respective magnetoresistive elements; and contact electrodes provided in the second oxide film and the first oxide film to reach the substrate from an upper surface of the second oxide film.

A magnetoresistive memory device of a present embodiment will be described hereinafter with reference to the accompanying drawings.

The magnetic property of MTJ elements may be deteriorated if magnetic layers are oxidized by oxygen from a base oxide film during processing. Therefore, forming an interlayer nitride film in a portion of the base of MTJ elements other than bottom electrodes is considered. If the nitride film lies between layers, however, it becomes difficult to form a contact to connect an upper source line to a lower transistor. The following embodiments solve this problem.

FIRST EMBODIMENT

Figure 2:
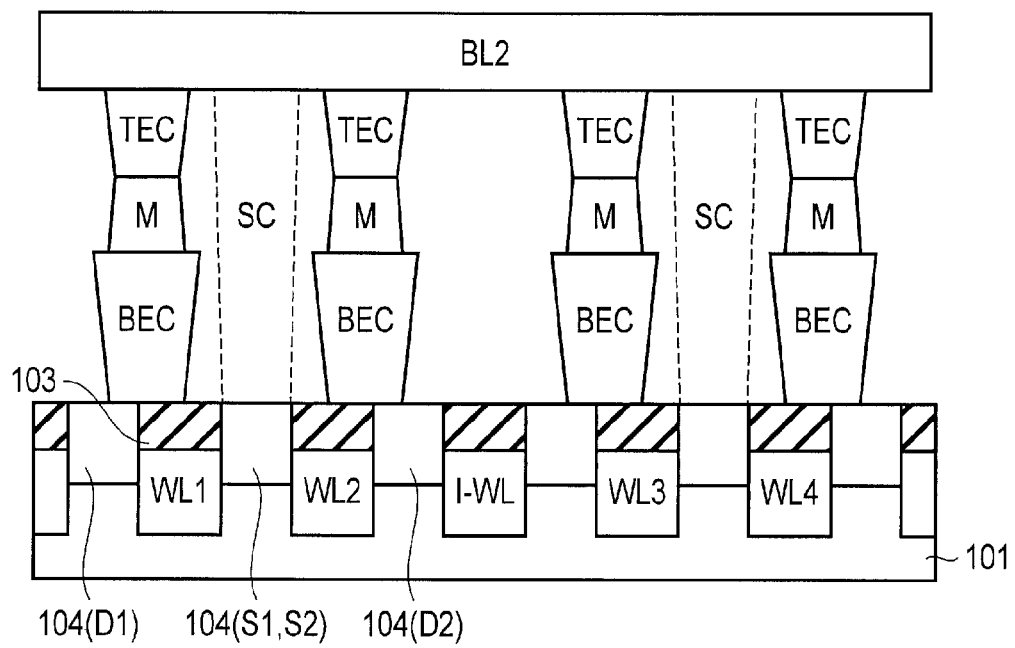
FIG. 2 is a cross-sectional view seen along I-I' of FIG. 1.
Figure 3:
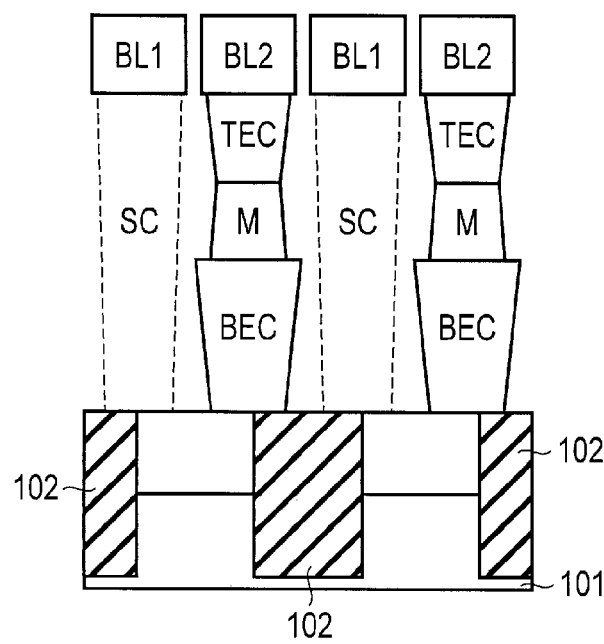
FIG. 3 is a cross-sectional view seen along II-II' of FIG. 1.

FIG. 1 is a plan view schematically showing a magnetoresistive memory device of a first embodiment. FIG. 2 is a cross-sectional view seen along I-I' of FIG. 1 and FIG. 3 is a cross-sectional view seen along II-II' of FIG. 1. A member indicated by broken lines in FIG. 2 and FIG. 3 is a plug SC which is located behind and cannot be seen in cross-sections I-I' and II-II'.

The magnetoresistive memory device of the present embodiment is an MRAM comprising MTJ elements (magnetoresistive elements) of a spin injection writing method as storage elements. A perpendicular magnetization film is used in the MTJ elements. The perpendicular magnetization film is a magnetization film having a magnetization direction (direction of a magnetization easy axis) nearly perpendicular to the film surface.

In the drawings, a silicon substrate (semiconductor substrate) is indicated by 101, and element isolation regions 102 are formed on the surface of the silicon substrate 101. The element isolation regions 102 define active regions.

The magnetoresistive memory device of the present embodiment comprises a first select transistor whose gate electrode is a word line WL1, a first MTJ element M connected to one of source/drain regions 104 (drain region D1) of the first select transistor, a second select transistor whose gate electrode is a word line WL2, and a second MTJ element M connected to one of source/drain regions 104 (drain region D2) of the second select transistor. In the drawings, a cap insulating film is indicated by 103. That is, a memory cell of the present embodiment is constituted by an MTJ (storage element) and a select transistor, and two select transistor of adjacent two memory cells share the other of the source/drain regions 104 (source region S1, S2).

A gate (gate insulating film, gate electrode) of each select transistor of the present embodiment is buried in the surface of the silicon substrate 101. That is, the gate of each select transistor has a buried gate (BG) structure. Similarly, a gate (word line I-WL) for element isolation also has the BG structure.

One of the source/drain regions 104 (D1) of the first select transistor is connected to the bottom of the first MTJ element M via a bottom electrode BEC. The top of the first MTJ element M is connected to a bit line BL2 via a top electrode TEC.

The other of the source/drain regions 104 (S1) of the first select transistor is connected to a bit line BL1 via a plug SC.

In the present embodiment, a planar pattern of the bottom electrode BEC, the MTJ element M, the top electrode TEC and the plug SC has a circular shape, but may have other shapes.

One of the source/drain regions 104 (D2) of the second select transistor is connected to the bottom of the second MTJ element M via a bottom electrode BEC. The top of the second MTJ element M is connected to bit line BL2 via a top electrode TEC.

The other of the source/drain regions 104 (S2) of the second select transistor is connected to bit line BL1 via a plug SC.

The first select transistor, the first MTJ element M, the second select transistor and the second MTJ element M (i.e., two memory cells) are provided per active region. Two adjacent active regions are separated by an element isolation region 102.

Word lines WL3 and WL4 correspond to word lines WL1 and WL2, respectively. Therefore, two memory cells are constituted by a first select transistor whose gate is word line WL3, a first MTJ element M connected to one of source/drain regions of the first select transistor, a second select transistor whose gate is word line WL4, and a second MTJ element M connected to one of source/drain regions of the second select transistor.

FIG. 4 is a detailed cross-sectional view of FIG. 3. An interlayer insulating film (first oxide film) 201 formed of silicon oxide film is formed on the silicon substrate 101 on which the element isolation regions 102 are formed. Bottom electrodes 203 corresponding to BEC in FIG. 3 are buried in interlayer insulating film 201. A part of each bottom electrode 203 protrudes from the upper surface of interlayer insulating film 201. That is, first bottom electrodes 203a of, for example, W, are buried in interlayer insulating film 201, and a second bottom electrode 203b is formed on each bottom electrode 203a. That is, the bottom electrodes 203 are buried in interlayer insulating film 201, and a part (second bottom electrode 203b) of each bottom electrode 203 protrudes above interlayer insulating film 201. A first sidewall nitride film 205 formed of silicon nitride film is formed on the side surface of the second bottom electrode 203b which is a part of the bottom electrode 203.

An MTJ element 300 constituted by a first magnetic layer 301 serving as a storage layer, a tunnel barrier layer 302 and a second magnetic layer 303 serving as a reference layer is formed on each bottom electrode 203. A cap layer 304 of, for example, W, is further formed on the magnetic layer 303 of the MTJ element 300. The cap layer is not necessarily formed and may be omitted. A second sidewall nitride film 305 formed of silicon nitride film is formed on the side surface of the MTJ element 300.

A top electrode 307 corresponding to TEC in FIG. 3 is formed on each cap layer 304. An interlayer insulating film (second oxide film) 306 formed of silicon oxide film is formed on the side of the top electrodes 307 and the silicon nitride films 305. The surface is thereby planarized. A bit line 401 serving as BL1 or BL2 is formed on each top electrode 307.

A manufacturing method of the magnetoresistive memory device of the present embodiment is hereinafter described. FIGS. 5A to 5F are cross-sectional views showing a process of manufacturing the magnetoresistive memory device of the present embodiment and correspond to a cross-section III-III' in FIG. 1.

Figure 5A:
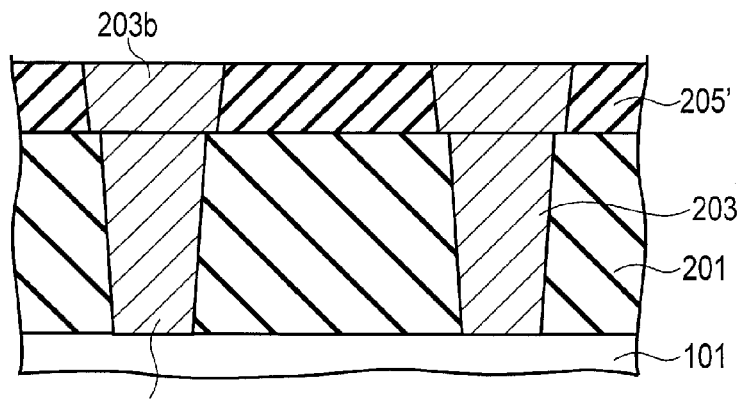
FIGS. 5A to 5F are cross-sectional views showing a process of manufacturing the magnetoresistive memory device of FIG. 1.

First, as shown in FIG. 5A, the element isolation regions and the select transistors (not shown) are formed in the silicon substrate 101. Next, a laminated structure of an interlayer insulating film (first oxide film) 201 formed of, for example, silicon oxide film, and a silicon nitride film 205' is formed, and bottom electrodes 203 buried in the laminated structure are formed on the silicon substrate 101.

There are three methods for forming the bottom electrodes 203.

The first is a method of executing a damascene process twice. More specifically, as shown in FIG. 6A, an interlayer insulating film 201 is first formed on the substrate 101 in a CVD process and then contact holes for bottom electrodes are formed. Next, as shown in FIG. 6B, a first bottom electrode 203a is buried in each contact hole in interlayer insulating film 201 in, for example, a damascene process. Before burying the bottom electrodes 203a, barrier metal (not shown) may be formed on the wall surface of each contact hole. Next, as shown in FIG. 6C, a nitride film 205' is formed on interlayer insulating film 201 and the first bottom electrodes 203a, and then openings are provided on nitride film 205'. After that, a second bottom electrode 203b is buried in each opening. The structure shown in FIG. 5A can be thereby obtained.

In FIG. 5A, a size (cross-section diameter) of the second bottom electrode 203a is greater than a size of the first bottom electrode 203b. However, the relationship may be reversed or the sizes may be equal to each other.

The second is a method of once executing a damascene process. More specifically, as shown in FIG. 7A, an interlayer insulating film 201 and a nitride film 205' are sequentially deposited on the substrate 101 in a CVD process. Then, as shown in FIG. 7B, contact holes for bottom electrodes are formed in nitride film 205' and the oxide film 201. Next, as shown in FIG. 7C, a bottom electrode 203 is buried in each contact hole.

The material of the bottom electrodes 203 is, for example, tantalum (Ta), tantalum nitride (TaN), titanium (Ti), titanium nitride (TiN), copper (Cu), tungsten (W) or ruthenium (Ru).

Figure 8A:
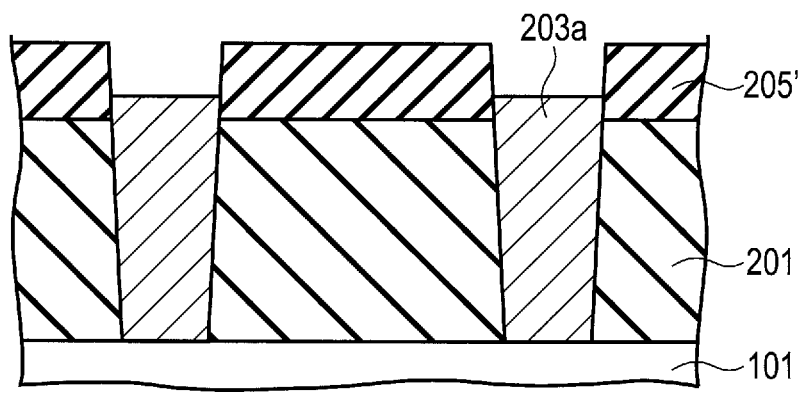
FIGS. 8A and 8B are cross-sectional views showing another example of the process of forming bottom electrodes.
Figure 8B:
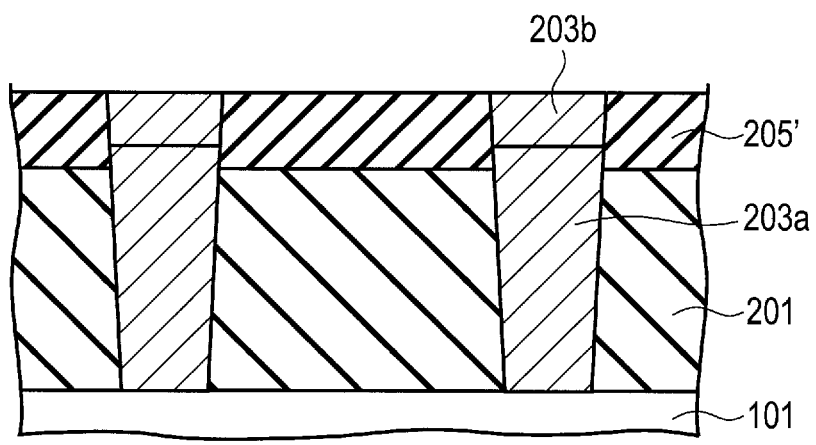

The third is a method of burying first bottom electrodes 203a, recessing the first bottom electrodes 203a and then burying second bottom electrodes 203b. In this method, first bottom electrodes 203a buried as shown in FIG. 7C are recessed. The first bottom electrodes 203a lower than the upper surface of the contact holes (nitride film 205') are thereby formed as shown in FIG. 8A. After that, second bottom electrodes 203b different in material from the first bottom electrodes 203a are buried in the contact holes as shown in FIG. 8B.

Figure 5B:
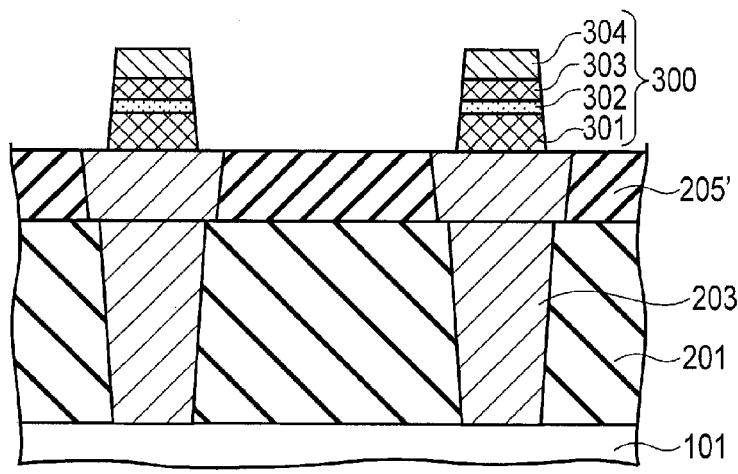

Next, as shown in FIG. 5B, an MTJ element (magnetoresistive element) 300 constituted by a first magnetic layer 301 serving as a storage layer, a tunnel barrier layer 302 and a second magnetic layer 303 serving as a reference layer, and a cap layer 304 on the MTJ element are formed on each bottom electrode 203. More specifically, layers 301, 302, 303 and 304 are each formed by sputtering, and then a hard mask (not shown) is formed. The cap layer 304, the second magnetic layer 303, the tunnel barrier layer 302 and the first magnetic layer 301 are sequentially processed by using the hard mask as a mask in an IBE process. The MTJ element 300 is thereby formed.

The silicon nitride film (interlayer nitride film) 205' is formed on interlayer insulating film 201 formed of silicon oxide film in order to prevent the magnetic layers 301 and 303 of the MTJ elements 300 from being oxidized by oxygen from the oxide film 201 during the MTJ process described above.

Figure 5C:
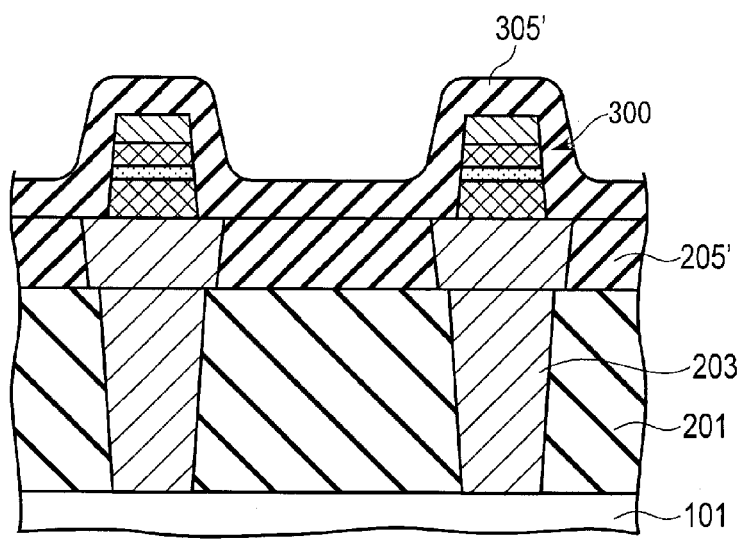

Next, as shown in FIG. 5C, a second nitride film 305' is formed on the first nitride film 205' so as to cover the MTJ elements 300.

Figure 5D:
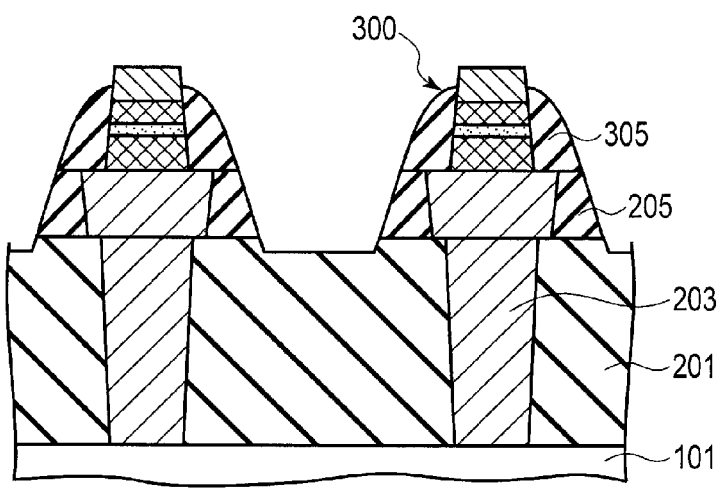

Then, as shown in FIG. 5D, sidewall nitride films 205 and 305 are formed by etching back nitride films 205' and 305' in an IBE or RIE process. That is, nitride films 205' and 305' are etched until the surface of interlayer insulating film 201 is exposed on the condition that a part of nitride films 205' and 305' is left on the sidewall. The second sidewall nitride film 305 formed of silicon nitride film is thereby formed on the side surface of each MTJ element 300. In addition, openings are formed on the first nitride film 305', and the first sidewall nitride film 205 formed of silicon nitride film is formed on the side surface of each bottom electrode 203.

At this time, the first sidewall nitride film 205 and the second sidewall nitride film 305 are tapered, the bottom being wider than the top. Then, the upper end of each bottom electrode 203 is completely covered with the bottom of the second sidewall nitride film 305, which makes the side surfaces of the first sidewall nitride film 205 and the second sidewall nitride film 305 continuous. In addition, covering the whole sidewall of each MTJ element 300 with the second sidewall nitride film 305 is effective against deterioration of the magnetic property of the MTJ elements.

Figure 5E:
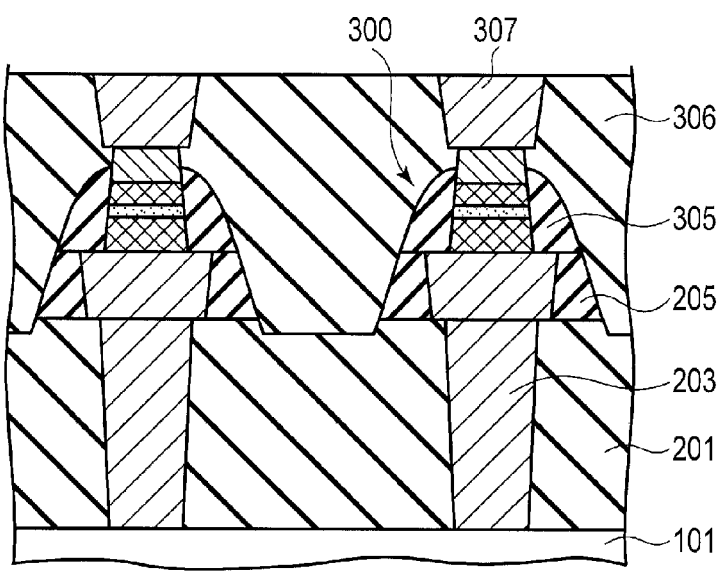

Next, as shown in FIG. 5E, an interlayer insulating film (second oxide film) 306 formed of silicon oxide film is deposited by, for example, the CVD method, and the surface is planarized. Following that, top electrodes 307 are formed by using a damascene process. More specifically, contact holes for top electrodes that reach the cap layers 304 on the MTJ elements 300, respectively, are formed in interlayer insulating film 306, and then top electrodes 307 are formed by burying a conductive film in the contact holes.

Figure 5F:
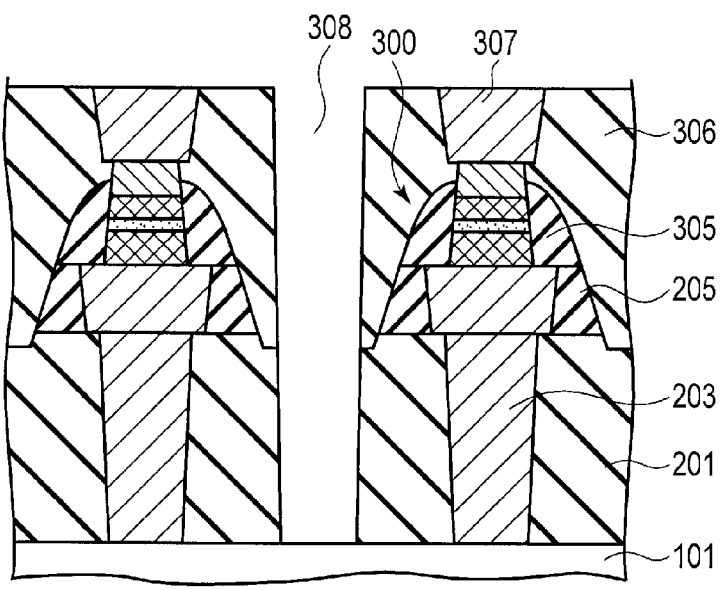

Next, as shown in FIG. 5F, contact holes 308 that reach the surface of the substrate 101 are formed by selectively etching interlayer insulating films 306 and 201 by using an RIE process. At this time, since nitride film 205' does not lie between the two interlayer insulating films 201 and 306 formed of silicon oxide films, the contact holes 308 can be formed merely by etching the oxide films. Therefore, even contact holes having a high aspect ratio can be easily formed in a simple process.

After that, contact plugs 309 are formed by burying a conductive film in the contact holes 308. The structure shown in FIG. 4 is completed by further forming bit lines 401.

The first sidewall nitride film 205 and the second sidewall nitride film 305 are formed such that the side surfaces of them are continuous, and the end of the bottom electrode 203 is covered with the first and second sidewall nitride films 205 and 305. Therefore, a short circuit does not occur between the bottom electrode 307 and the contact plug 309 even if the contact hole 308 is misaligned.

FIG. 9 is a cross-sectional view showing a structure of a modified example of the first embodiment. FIG. 9 is different from FIG. 4 in that each bottom electrode 203 has a unitary structure. That is, in the example, the bottom electrodes 203 are formed after the contact holes for bottom electrodes are formed in interlayer insulating film 201 and nitride film 205' as shown in FIGS. 7A to 7C. The structure shown in FIG. 9 is the same as the above structure except for this point, and can also be prepared in the above method.

According to the present embodiment, since the first nitride film 205' having the interlayer nitride film structure is formed on the underlayer before forming the MTJ elements 300, the oxide film 201 is not etched during the MTJ process. Therefore, the magnetic property of the MTJ elements can be prevented from being deteriorated along with the MTJ process. In addition, the first nitride film 205' is etched-back at the same time as the etch-back of the second nitride film 305', and an opening is formed between adjacent MTJ elements 300. Accordingly, it is not necessary to etch nitride film 205' when forming the contact holes 308 for source contact by, for example, RIE. Therefore, even contact holes 308 having a high aspect ratio can be easily formed in a single process.

SECOND EMBODIMENT

Figure 10A:
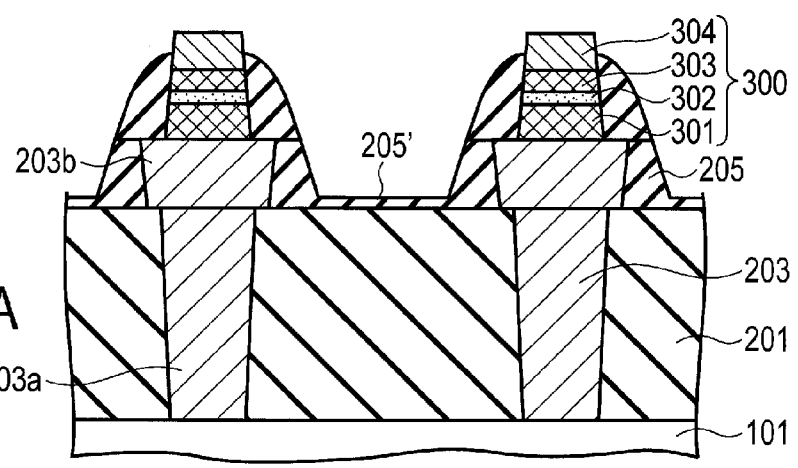
FIGS. 10A to 10C are cross-sectional views showing a process of manufacturing a magnetoresistive memory device of a second embodiment.
Figure 10B:
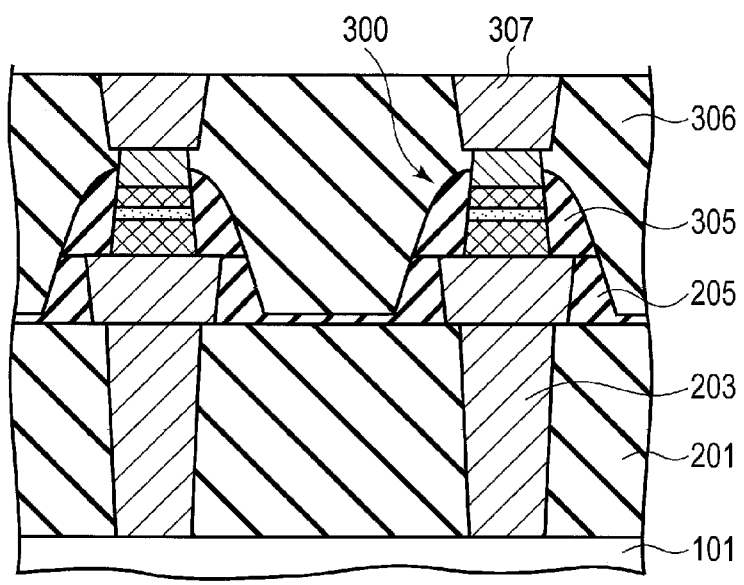
Figure 10C:
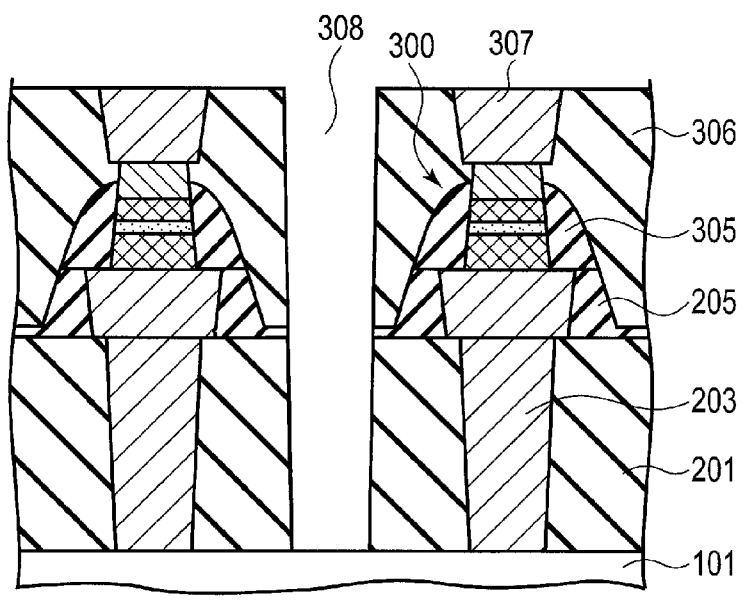

FIGS. 10A to 10C are cross-sectional views showing a process of manufacturing a magnetoresistive memory device of a second embodiment. FIGS. 10A to 10C correspond to FIGS. 5D to 5F, respectively. In FIGS. 10A to 10C, the same portions are represented by the same reference numbers and their descriptions are omitted.

The present embodiment is different from the above-described first embodiment in an amount of etch-back of the nitride films.

The present embodiment is different from the first embodiment after MTJ elements 300 are formed and then a second nitride film 305' is formed as shown in FIGS. 5A to 5C.

After that, as shown in FIG. 10A, a second sidewall nitride film 305 is formed on the side surface of each MTJ element 300 and a first sidewall nitride film 205 is formed on the side surface of each bottom electrode 203 by etching back nitride films 205' and 305' in an IBE or RIE process in the present embodiment, similarly to the first embodiment. At this time, the amount of the etch-back is less than that of the first embodiment.

That is, nitride films 205' and 305' are etched on the condition that a part of nitride films 205' and 305' is left on the sidewall such that the first nitride film 205' is sufficiently thin between adjacent MTJ elements 300. That is, nitride film 205' is not necessarily etched until the oxide film 201 is exposed, but may be etched until nitride film 205' becomes sufficiently thin.

Next, as shown in FIG. 10B, an interlayer insulating film (second oxide film) 306 such as a silicon oxide film is formed and top electrodes 307 are further formed, similarly to the first embodiment.

Next, as shown in FIG. 10C, contact holes 308 are formed by selectively etching interlayer insulating films 306 and 201 and nitride film 205', similarly to the first embodiment. At this time, since nitride film 205' between interlayer insulating films 201 and 306 is sufficiently thin, nitride film 205' can be easily removed even by etchant suitable for etching an oxide film. Therefore, even contact holes 308 having a high aspect ratio can be easily formed in a simple process.

After that, contact plugs 309 are formed by burying a conductive film in the contact holes 308. The MRAM structure is completed by further forming bit lines 401.

FIG. 11 is a cross-sectional view showing a structure of a modified example of the second embodiment. In the example, each bottom electrode 203 has a unitary structure by adopting the process shown in FIGS. 7A to 7C, similarly to FIG. 9. The structure shown in FIG. 11 is the same as the structure shown in FIG. 10C except the bottom electrodes 203, and can also be prepared in the above method.

According to the present embodiment, nitride film 205' can be etched by etchant suitable for etching an oxide film by making portions of nitride film 205' in which the contact holes 308 are formed sufficiently thin. Therefore, the contact holes 308 can be easily formed in a single process similarly to the first embodiment. The same effect as the first embodiment can be thus achieved.

MODIFIED EXAMPLE

The present invention is not limited to the above-described embodiments.

The first and second oxide films are not limited to silicon oxide films, but may be any insulating films as long as the films include oxygen. Similarly, the first and second sidewall nitride films are not limited to silicon nitride films, but may be any insulating films as long as the films include nitrogen.

Etching to form contact holes is not limited to RIE, but may be any method as long as the oxide film can be selectively etched in the method. The basic structure of the magnetoresistive element is the three-layer structure obtained by sandwiching a nonmagnetic layer between magnetic layers, but a shift adjustment layer and other layers may be added to the structure. The cap layer is not necessarily formed on the magnetoresistive element and may be omitted.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetoresistive memory device comprising:
a substrate;
a first oxide film provided on the substrate;
bottom electrodes provided in the first oxide film, a part of each of the bottom electrodes protruding above the first oxide film;
magnetoresistive elements provided on the respective bottom electrodes;
sidewall nitride films provided on side surfaces of the parts of the respective bottom electrodes and side surfaces of the respective magnetoresistive elements, wherein side surfaces of the sidewall nitride films are continuous over the side surfaces of the parts of the respective bottom electrodes and the side surfaces of the respective magnetoresistive elements, and the side surfaces of the sidewall nitride films are smoothly connected;
a second oxide film provided on the magnetoresistive elements, the sidewall nitride films and the first oxide film;
top electrodes provided in the second oxide film and connected to the respective magnetoresistive elements; and
contact electrodes provided in the second oxide film and the first oxide film to reach the substrate from an upper surface of the second oxide film.

2. The device of claim 1, wherein each of the sidewall nitride films comprises a first sidewall nitride film provided on the side surface of the part of the bottom electrode and a second sidewall nitride film provided on the side surface of the magnetoresistive element.

3. The device of claim 1, wherein each of the magnetoresistive elements has a laminated structure obtained by sandwiching a nonmagnetic layer between magnetic layers.

4. The device of claim 1, wherein each of the magnetoresistive elements is an MTJ element obtained by sandwiching a barrier layer between a storage layer and a reference layer.

5. The device of claim 1, wherein each of the sidewall nitride films has a taper shape having a bottom wider than a top.

6. The device of claim 1, wherein the bottom electrodes and the magnetoresistive elements are arrayed in a matrix on the substrate.

7. The device of claim 1, further comprising sources and drains of MOS transistors on the substrate,
wherein the bottom electrodes are connected to the respective drains and the contact electrodes are connected to the respective sources.

8. The device of claim 6, wherein each of the contact electrodes is positioned equally distant from adjacent four of the magnetoresistive elements.

9. A magnetoresistive memory device comprising:
a substrate;
a first oxide film provided on the substrate;
bottom electrodes provided in the first oxide film, a part of each of the bottom electrodes protruding above the first oxide film;
magnetoresistive elements provided on the respective bottom electrodes;
a nitride film provided on side surfaces of the parts of the respective bottom electrodes, side surfaces of the magnetoresistive elements and the first oxide film, wherein side surfaces of the nitride film are continuous over the side surfaces of the parts of the respective bottom electrodes and the side surfaces of the respective magnetoresistive elements, and a thickness of the nitride film on the first oxide film is less than a thickness of the nitride film on the side surfaces of the bottom electrodes and a thickness of the nitride film on the side surfaces of the magnetoresistive elements;
a second oxide film provided on the magnetoresistive elements, the nitride film and the first oxide film;
top electrodes provided in the second oxide film and connected to the respective magnetoresistive elements; and
contact electrodes provided in the second oxide film and the first oxide film to reach the substrate from an upper surface of the second oxide film.

10. A manufacturing method of a magnetoresistive memory device, the method comprising:
forming a laminated structure of a first oxide film and a first nitride film and bottom electrodes buried in the laminated structure on a substrate;
forming magnetoresistive elements on the respective bottom electrodes;
forming a second nitride film on the substrate on which the magnetoresistive elements are formed;
forming first sidewall nitride films formed of the first nitride film on side surfaces of the respective bottom electrodes and forming second sidewall nitride films formed of the second nitride film on side surfaces of the respective magnetoresistive elements by etching the first and second nitride films such that side surfaces of the first sidewall nitride films and side surfaces of the second sidewall nitride films are continuous, and the side surfaces of the sidewall nitride films are smoothly connected;

forming a second oxide film on the substrate on which the first sidewall nitride films and second sidewall nitride films are formed;

forming contact holes which penetrate the second oxide film and the first oxide film from a surface of the second oxide film and reach the substrate; and burying contact electrodes in the respective contact holes.

11. The method of claim 10, wherein the etching of the nitride films comprises etching the nitride films until a surface of the first oxide film is exposed from a portion other than the first sidewall nitride films.

12. The method of claim 10, further comprising:

reducing a thickness of a portion of the first nitride film other than the first sidewall nitride films by etching the nitride films.

13. The method of claim 10, wherein the forming the laminated structure and the bottom electrodes comprises:

forming the first oxide film on the substrate;

burying first bottom electrodes in the first oxide film;

forming the first nitride film on the first oxide film and the first bottom electrodes; and burying second bottom electrodes connected to the respective first bottom electrodes in the first nitride film.

14. The method of claim 10, wherein the forming the laminated structure and the bottom electrode comprises:

forming the first oxide film on the substrate;

forming the first nitride film on the first oxide film;

forming contact holes for bottom electrodes in the first nitride film and the first oxide film; and burying the bottom electrodes in the respective contact holes for bottom electrodes.

15. The method of claim 10, wherein each of the magnetoresistive elements has a laminated structure obtained by sandwiching a nonmagnetic layer between magnetic layers.

16. The method of claim 10, wherein the etching of the nitride films comprises forming each of the first nitride films and each of the second nitride films in a taper shape having a bottom wider than a top.

17. The method of claim 10, wherein the etching of the nitride films comprises etching back a whole surface by IBE or RIE.

18. The method of claim 11, further comprising:

forming openings in the portion of the first nitride film other than the first sidewall nitride films by etching the nitride films.

* * * * *